(12) United States Patent  
Zhu et al.

(10) Patent No.: US 12,119,067 B2  
(45) Date of Patent: Oct. 15, 2024

(54) COMPARISON CIRCUIT AND MEMORY CHIP

(71) Applicant: CHANGXIN MEMORY TECHNOLOGIES, INC., Hefei (CN)

(72) Inventors: Lei Zhu, Shanghai (CN); Jianyong Qin, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 254 days.

(21) Appl. No.: 17/818,956

(22) Filed: Aug. 10, 2022

(65) Prior Publication Data

US 2022/0383959 A1 Dec. 1, 2022

Related U.S. Application Data

(63) Continuation of application No. PCT/CN2021/113100, filed on Aug. 17, 2021.

(30) Foreign Application Priority Data

Dec. 16, 2020 (CN) .......................... 202011487000.0

(51) Int. Cl.  
*G11C 7/00* (2006.01)  
*G01R 31/317* (2006.01)  
(Continued)

(52) U.S. Cl.  
CPC ........ *G11C 16/26* (2013.01); *G01R 31/31703* (2013.01); *G11C 11/401* (2013.01);  
(Continued)

(58) Field of Classification Search  
CPC ......... G11C 7/1066; G11C 7/14; G11C 7/062; G11C 7/22; G11C 7/051  
(Continued)

(56) References Cited

U.S. PATENT DOCUMENTS 8,953,383 B2  2/2015  Yoo  
9,966,121 B2  5/2018  Kim  
(Continued)

FOREIGN PATENT DOCUMENTS

CN  102957405 A  3/2013  
CN  103886907 A  6/2014  
(Continued)

OTHER PUBLICATIONS

International Search Report in the international application No. PCT/CN2021/113100, mailed on Nov. 17, 2021.

*Primary Examiner* — Son T Dinh  
(74) *Attorney, Agent, or Firm* — Syncoda LLC; Feng Ma

(57) ABSTRACT

A comparison circuit includes a comparison module, a state judgment module and a state storage module. The comparison module includes a first input end connected to a voltage to be measured and a second input end connected to a reference voltage. The state judgment module includes a first input end connected to a first output end of the comparison module and a second input end connected to a second output end of the comparison module. The state storage module includes an input end connected to the first output end of the comparison module and an enable end connected to an output end of the state judgment module. The embodiments of the disclosure may improve processing efficiency of the comparison circuit.

16 Claims, 4 Drawing Sheets

(51) Int. Cl.
   *G11C 11/401*   (2006.01)
   *G11C 16/10*   (2006.01)
   *G11C 16/26*   (2006.01)
   *G11C 16/32*   (2006.01)
   *H03K 19/21*   (2006.01)

(52) U.S. Cl.
   CPC .............. *G11C 16/10* (2013.01); *G11C 16/32* (2013.01); *H03K 19/21* (2013.01)

(58) Field of Classification Search
   USPC .................................................. 365/189.07
   See application file for complete search history.

(56) References Cited

U.S. PATENT DOCUMENTS

| | | | |
|---|---|---|---|
| 10,601,322 | B1 | 3/2020 | Bogue |
| 2011/0197034 | A1* | 8/2011 | Nakanishi ........... G06F 12/0246 |
| | | | 711/E12.001 |
| 2014/0177332 | A1 | 6/2014 | Yoo et al. |
| 2017/0358337 | A1 | 12/2017 | Kim |
| 2020/0194039 | A1 | 6/2020 | Chong et al. |

FOREIGN PATENT DOCUMENTS

| | | |
|---|---|---|
| CN | 104184440 A | 12/2014 |
| CN | 110311663 A | 10/2019 |
| CN | 213583123 U | 6/2021 |

* cited by examiner

COMPARISON CIRCUIT AND MEMORY CHIP

CROSS-REFERENCE TO RELATED APPLICATIONS

This is a continuation application of International Patent Application No. PCT/CN2021/113100 filed on Aug. 17, 2021, which claims priority to Chinese Patent Application No. 202011487000.0 filed on Dec. 16, 2020. The disclosures of the above-referenced applications are hereby incorporated by reference in their entirety.

BACKGROUND

In a Dynamic Random Access Memory (DRAM), it is always necessary to rapidly compare low voltages and output a low voltage identification result to ensure the normal output of the low voltages due to the sensitivity characteristics of the low voltages. In some implementations, an error amplifier operating in a high voltage domain is generally adopted to build a comparison circuit to achieve the function. However, high voltages in the DRAM are generated by a charge pump, the efficiency is low, and an error comparator usually needs an additional bias circuit. Therefore, the power consumption of such comparison circuit is large, the output speed of the comparison result is low, and the requirements of a DRAM chip on high speed and low power consumption of low voltage comparison are difficult to meet.

It should be noted that the information disclosed in the background above is only used to enhance an understanding of the background of the present disclosure, and thus may include information that does not constitute prior art known to those of ordinary skill in the art.

SUMMARY

The present disclosure relates to the technical field of integrated circuits, and in particular to a comparison circuit capable of rapidly comparing variable voltages and a memory chip applying the comparison circuit.

An object of the present disclosure is to provide a comparison circuit and a memory chip, which may overcome, at least to some extent, the problems of insufficient comparison speed, high power consumption and the like of a low voltage comparison circuit due to limitations and disadvantages of some implementations.

According to a first aspect of the present disclosure, a comparison circuit is provided. The comparison circuit includes a comparison module, a state judgment module, and a state storage module. The comparison module includes a first input end connected to a voltage to be measured and a second input end connected to a reference voltage. The state judgment module includes a first input end connected to a first output end of the comparison module and a second input end connected to a second output end of the comparison module. The state storage module includes an input end connected to the first output end of the comparison module and an enable end connected to an output end of the state judgment module.

According to a second aspect of the present disclosure, a memory chip is provided. The memory chip includes the comparison circuit as described above, a first power supply, and a second power supply. The first power supply serves as the voltage to be measured. The second power supply supplies power to the comparison circuit.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure. It is apparent to those of ordinary skill in the art that the drawings in the following description are only some embodiments of the present disclosure, and that other drawings may be obtained from these drawings without any creative work.

DETAILED DESCRIPTION

Figure 1:
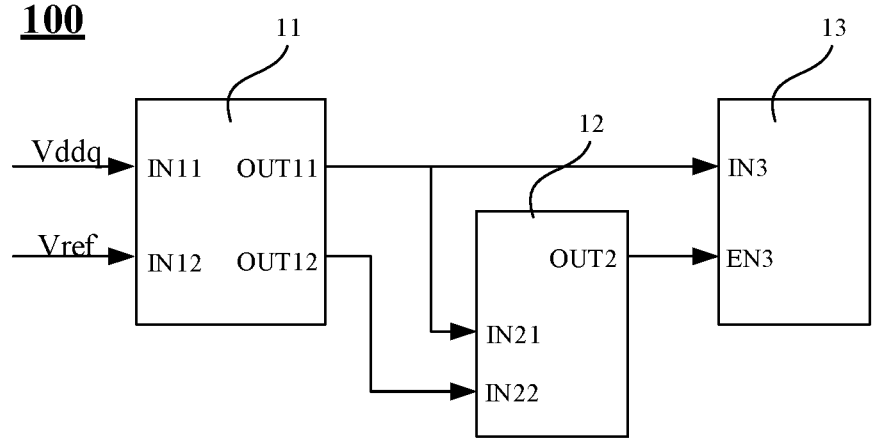
FIG. 1 is a schematic structure diagram of a comparison circuit in an exemplary embodiment of the present disclosure.

Example implementations will now be described more fully with reference to the accompanying drawings. However, the example implementations can be implemented in various forms and should not be construed as being limited to the examples set forth herein. Rather, these implementations are provided so that the present disclosure will be more comprehensive and complete, and will fully convey the conceptions of the exemplary implementations to those skilled in the art. The described features, structures or characteristics may be combined in one or more implementations in any suitable manner. In the description below, numerous specific details are provided to give a sufficient understanding of the implementations of the present disclosure. However, those skilled in the art will appreciate that the technical solutions of the present disclosure can be practiced while one or more of the specific details are omitted, or other methods, components, devices, steps, and the like may be employed. In other cases, the well-known technical solutions are not illustrated or described in detail to avoid superseding what really counts, which cause aspects of the present disclosure to become obscure.

Further, the drawings are only schematic illustrations of the present disclosure, in which the same reference numerals refer to the same or similar parts, and thus repeated description of the reference numerals is omitted. Some of the block diagrams illustrated in the drawings are functional entities and do not necessarily correspond to physically or logically independent entities. The functional entities may be implemented in software, or in one or more hardware modules or integrated circuits, or in different networks and/or processor devices and/or microcontroller devices.

The example implementations of the present disclosure will now be described in detail in combination with the accompanying drawings.

FIG. 1 is a schematic structure diagram of a comparison circuit in an exemplary embodiment of the present disclosure.

Referring to FIG. 1, the comparison circuit 100 may include a comparison module 11, a state judgment module 12, and a state storage module 13.

A first input end IN11 of the comparison module 11 is connected to a voltage to be measured Vddq, and a second input end IN12 is connected to a reference voltage Vref.

A first input end IN21 of the state judgment module 12 is connected to a first output end OUT11 of the comparison module 11, and a second input end IN22 is connected to a second output end OUT12 of the comparison module 11.

An input end IN3 of the state storage module 13 is connected to the first output end OUT11 of the comparison module 11, and an enable end EN3 is connected to an output end OUT2 of the state judgment module 12.

In the embodiment illustrated in FIG. 1, the voltage to be measured Vddq changes from a first voltage V1 to a second voltage V2 within time T. The reference voltage Vref is greater than the first voltage V1 and less than the second voltage V2. The time T varies depending on the type of the voltage to be measured.

The first output end OUT11 of the comparison module 11 is configured to output a voltage detection result stored in the state storage module 13. The second output end OUT12 is configured to output a level opposite to the state of OUT12. For example, when an output level of OUT11 is high, an output level of OUT12 is low. When the output level of OUT11 is low, the output level of OUT12 is high. In the embodiment of the present disclosure, the high or low levels are relatively high or low, and specific voltage values of the levels may vary depending on circuit settings.

An output signal of the state judgment module 12 may be configured to control the storage timing of the state storage module 13. That is, the storage timing of the state storage module 13 is controlled according to the output timing of the comparison module 11, so that an output signal of the comparison module 11 may be accurately stored. When the comparison module 11 needs to realize rapid comparison, a duration for which the output signal of the comparison module 11 is read by a subsequent circuit may be maintained through the state storage module 13, so that the power consumption of the output end of the comparison circuit for maintaining a sufficient read duration is avoided. In addition, the state storage module 13 does not need an additional clock drive, so that the layout wiring space is saved.

Figure 2:
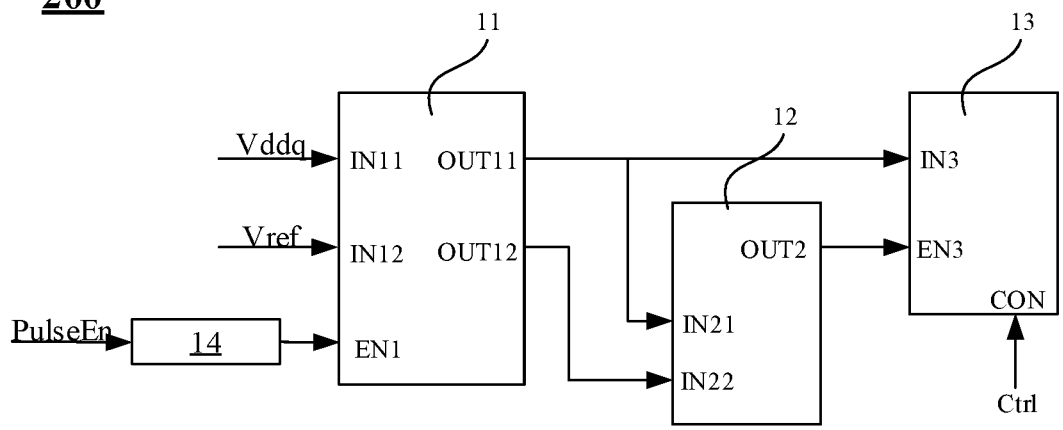
FIG. 2 is a schematic structure diagram of a comparison circuit in another embodiment of the present disclosure.

FIG. 2 is a schematic structure diagram of a comparison circuit in another embodiment of the present disclosure.

Referring to FIG. 2, the comparison circuit 100 may further include a pulse generation circuit 14.

An output end OUT4 of the pulse generation circuit 14 is connected to an enable end EN1 of the comparison module 11.

In an exemplary embodiment of the present disclosure, an input end IN4 of the pulse generation circuit 14 is configured to receive a pulse enable signal PulseEn. A control end CON of the state storage module 13 is configured to receive a storage control signal Ctrl.

In the embodiment illustrated in FIG. 2, the enable end of the comparison module 11 is controlled by a pulse signal output by the pulse generation circuit 14, so that an input signal of the input end may be read only when a pulse level is an enable level, the operation of the comparison module 11 may not be maintained at any time, the comparison module 11 is closed after the comparison of the comparison module 11 is completed, thereby effectively reducing the power consumption of the comparison module 11. In addition, since an enable state of the comparison module 11 is controlled by the pulse signal, the reading timing of the comparison module 11 may be accurately controlled. Since the output signal of the comparison module 11 is stored by the state storage module 13, a time interval between two comparisons of the comparison module 11 can be shortened, and the power consumption of the comparison module 11 can be effectively reduced. The state storage module 13 and the pulse generation circuit 14 are both controlled by corresponding enable signals, so that the flexibility of circuit settings can be improved, and an operating state of the circuit can be changed without changing a circuit form when the state storage module 13 and/or the pulse generation circuit 14 do not need to operate.

Figure 3:
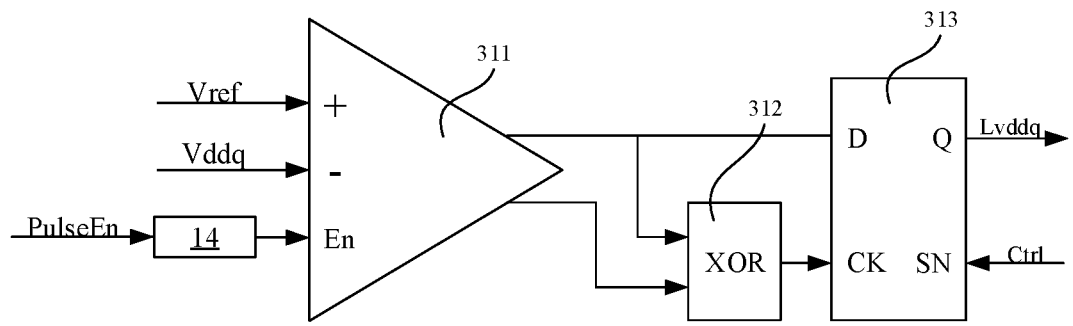
FIG. 3 is a schematic circuit diagram of a comparison circuit in an exemplary embodiment of the present disclosure.

FIG. 3 is a schematic circuit diagram of a comparison circuit in an exemplary embodiment of the present disclosure.

Referring to FIG. 3, in one embodiment, the comparison module 311 is a comparator, the state storage module 313 is a flip-flop or a register (e.g., a D flip-flop in FIG. 3 and the following description), and the state judgment module 312 includes an exclusive OR gate. An output signal of the exclusive OR gate 312 is connected to a clock end of the D flip-flop 313. A first output end of the comparator 311 is connected to an input end of the D flip-flop 313.

In the embodiment illustrated in FIG. 3, an inverting input end of the comparator 311 is connected to the voltage to be measured Vddq, an non-inverting input end is connected to the reference voltage Vref, and two output ends are connected to the exclusive OR gate 312. When the comparator 311 is not enabled, the outputs at the two output ends of the comparator 311 both are low level 0 or high level 1, and in this case, the output of the exclusive OR gate 312 is low level 0. When the comparator 311 is enabled, the outputs at the two output ends of the comparator 311 are high level 1 and low level 0. Therefore, an output signal of the exclusive OR gate 312 is high level 1 after the comparator 311 is enabled. The output signal of the exclusive OR gate 312 is connected to the clock end of the D flip-flop 313, and therefore, when the comparator 311 is enabled, the clock drive end CK of the D flip-flop 313 is changed from 0 to 1, and the D flip-flop 313 saves data of the data port D. Even if the comparator 311 is then turned off again, the data saved by the D flip-flop 313 is not lost. Since the comparator 311 operates only in a state where the pulse level is high and does not operate in a state where the pulse level is low, the power consumption of the comparator 311 is reduced. In addition, the D flip-flop 313 operates only on edges where the output level of the exclusive OR gate changes, and does not generate power consumption during the period when the output level of the exclusive OR gate does not change. Therefore, the circuit illustrated in FIG. 3 has a lower power consumption than some other implementations.

In the embodiment illustrated in FIG. 3, the enable end of the comparator 311 is connected to the pulse generation circuit 14. Since the control end of the D flip-flop 313 is controlled by the output signal of the exclusive OR gate 312 and an output signal of the comparator 311 can be latched by the D flip-flop 313 in time, an enable level of the pulse generation circuit 14 may be maintained for a short duration, that is, each maintenance duration of the enable level is only required to allow the comparator 311 to read an input signal and output a comparison result. Therefore, the comparator 311 does not need to operate at any time, and the power consumption is further reduced.

It is to be appreciated that embodiments of the modules illustrated in the embodiment of FIG. 3 are examples. In practice, the functions of the modules may be implemented by other circuits according to the principles illustrated in FIGS. 1 and 2 by those skilled in the art, which is not particularly limited in the present disclosure.

Figure 4:
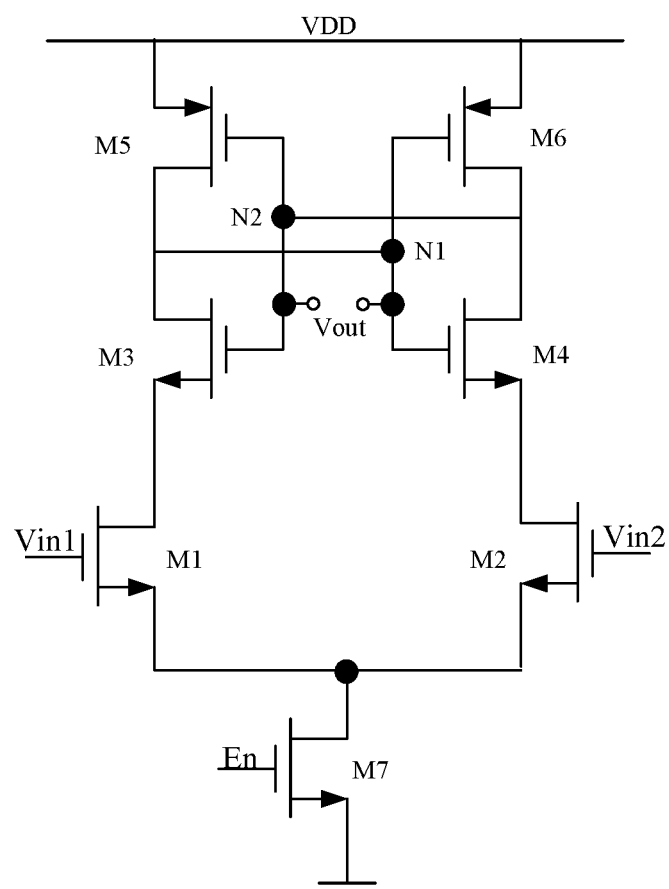
FIG. 4 is a schematic structure diagram of a comparison module in an exemplary embodiment of the present disclosure.

FIG. 4 is a schematic structure diagram of a comparison module in an exemplary embodiment of the present disclosure.

Referring to FIG. 4, the comparison module 11 may include a first transistor M1, a second transistor M2, a third transistor M3, a fourth transistor M4, a fifth transistor M5, a sixth transistor M6, and a seventh transistor M7.

A gate of the first transistor M1 serves as the first input end of the comparison module 11.

A gate of the second transistor M2 serves as the second input end of the comparison module 11.

A source of the third transistor M3 is connected to a drain of the first transistor M1.

A source of the fourth transistor M4 is connected to a drain of the second transistor M2.

A drain of the fifth transistor M5 serves as the first output end of the comparison module 11 and is connected to a drain of the third transistor M3 and a gate of the fourth transistor M4, and a source is connected to a power end VDD.

A drain of the sixth transistor M6 serves as the second output end of the comparison module 11 and is connected to a drain of the fourth transistor M4 and a gate of the third transistor M3, and a source is connected to the power end VDD.

A gate of the seventh transistor M7 serves as the enable end of the comparison module 11, and a drain is connected to a source of the first transistor M1 and a source of the second transistor M2, and a source is grounded.

In one exemplary embodiment of the present disclosure, the first transistor M1, the second transistor M2, the third transistor M3, the fourth transistor M4, and the seventh transistor M7 are all N-type transistors, and the fifth transistor M5 and the sixth transistor M6 are both P-type transistors.

Referring to FIG. 4, in addition to improving circuits externally connected to the comparison module 11 to reduce power consumption and improve comparison speed, the embodiment of the present disclosure also improves circuits of the comparison module 11. In the embodiment illustrated in FIG. 4, a dynamic comparator with a strong ARM structure is constructed by using the first transistor M1 to the seventh transistor M7. In the dynamic comparator, gates of two transistors of the left bridge arm (formed by the third transistor M3 and the fifth transistor M5) are both connected to a drain connection point (first node N1) of two transistors of the right bridge arm (formed by the fourth transistor M4 and the sixth transistor M6), and the first node N1 serves as an output end of the dynamic comparator. Gates of the two transistors of the right bridge arm are both connected to a drain connection point (second node N2) of the two transistors of the left bridge arm, and the second node N2 serves as another output end of the dynamic comparator. When the enable signal En is a low level, the seventh transistor M7 is turned off, a path M5-M3-M1 and a path M6-M4-M2 have no low potential, the first node N1 of the drain of the fifth transistor M5 and the second node N2 of the drain of the sixth transistor M6 are both pulled to a high level VDD, and the two paths are at the high level from the power supply VDD to the drain of the seventh transistor. When the enable signal is a high level, the seventh transistor M7 is turned on, the first transistor M1 and the second transistor M2 are turned on under the influence of input voltages Vin1 and Vin2. When Vin1 and Vin2 are not equal, the on-resistances of the first transistor M1 and the second transistor M2 are not equal. That is, the speed at which the first node N1 or the second node N2 discharges to the low level are not equal. If Vin1 is greater than Vin2, the discharge rate of the first node N1 is greater than that of the second node N2, the voltage of the first node N1 reaches a low level GND more rapidly, the fourth transistor M4 is turned off, the sixth transistor M6 is turned on, the voltage of the second node N2 of the drain of the fourth transistor M4 is equal to the high level VDD and greater than the voltage GND of the first node N1, and a voltage comparison result is output. Similarly, if Vin1 is less than Vin2, the voltage of the second node N2 reaches the low level GND more rapidly, the third transistor M3 is turned off, the fifth transistor M5 is turned on, the voltage of the first node N1 of the drain of the third transistor M3 is equal to the high level VDD and greater than the voltage GND of the second node N2, and a voltage comparison result is output. Since a discharge speed is greater than a charge speed, the circuit of the embodiment illustrated in FIG. 4 can output the voltage comparison result faster than some implementations, thereby improving the speed of the comparator.

Figure 5:
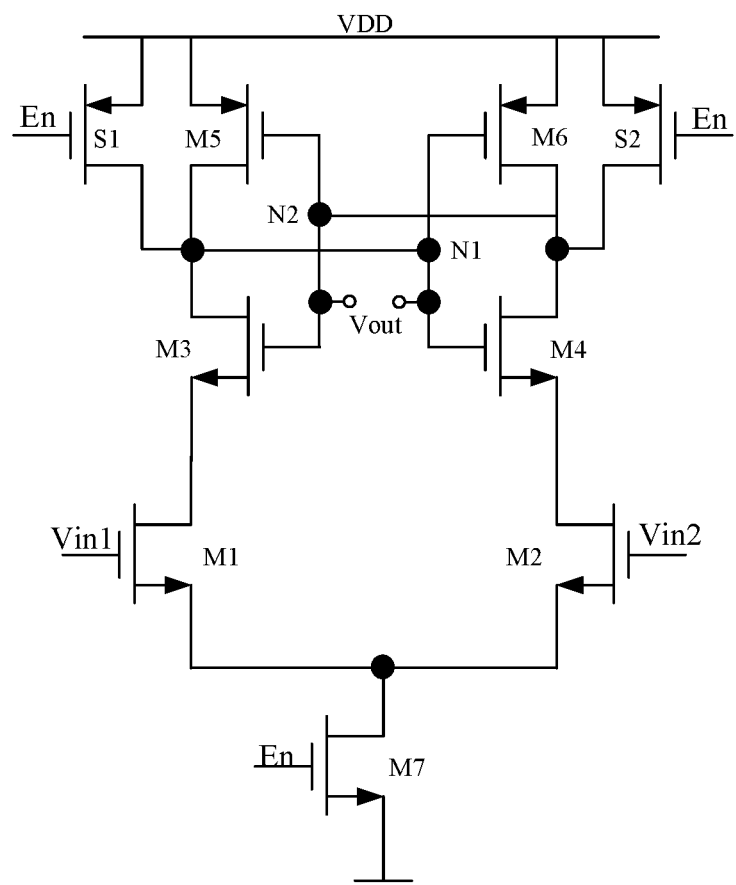
FIG. 5 is a schematic structure diagram of a comparison module in another embodiment of the present disclosure.

FIG. 5 is a schematic structure diagram of a comparison module in another embodiment of the present disclosure.

Referring to FIG. 5, the comparison module 11 may further include a first switching transistor S1 and a second switching transistor S2.

A first end of the first switching transistor S1 is connected to the power end VDD, a second end is connected to the first output end of the comparison module 11, and a control end is connected to the enable end of the comparison module 11.

A first end of the second switching transistor S2 is connected to the power end, a second end is connected to the second output end of the comparison module 11, and a control end is connected to the enable end of the comparison module 11.

In the embodiment illustrated in FIG. 5, the first switching transistor S1 parallel to the fifth transistor M5 is added, and the control end of the first switching transistor S1 is connected to the enable end of the comparator. The second switching transistor S2 parallel to the sixth transistor M6 is added, and the control end of the second switching transistor S2 is connected to the enable end of the comparator. Thus, when the first switching transistor S1 and the second switching transistor S2 are both turned on under control of a low level (in some embodiments, the low level exists in a pulse signal generated by the pulse generation circuit 14) connected to the enable end, the seventh transistor M7 is turned off, and the first node N1 and the second node N2 are both pulled to the high level VDD. When the first switching transistor S1 and the second switching transistor S2 are both turned off under control of a high level (similarly, a high level in the pulse signal) connected to the enable end, the seventh transistor M7 is turned on, and one of the first node N1 and the second node N2 will discharge to the low level GND faster, so that one of the first node N1 and the second node N2 is at the high level VDD and the other node is at the low level GND (referring to the description on the embodiment illustrated in FIG. 4). Due to the arrangement of the first switching transistor S1 and the second switching transistor S2, the voltages of the first node N1 and the second node N2 are directly set to VDD, instead of charging the voltages of the first node N1 and the second node N2 to VDD through a junction capacitor of the sixth transistor M6 and a junction capacitor of the fifth transistor M5 in the embodiment illustrated in FIG. 4. Therefore, the arrangement of the first switching transistor S1 and the second switching transistor S2 increases a comparison speed of the comparator.

Figure 6:
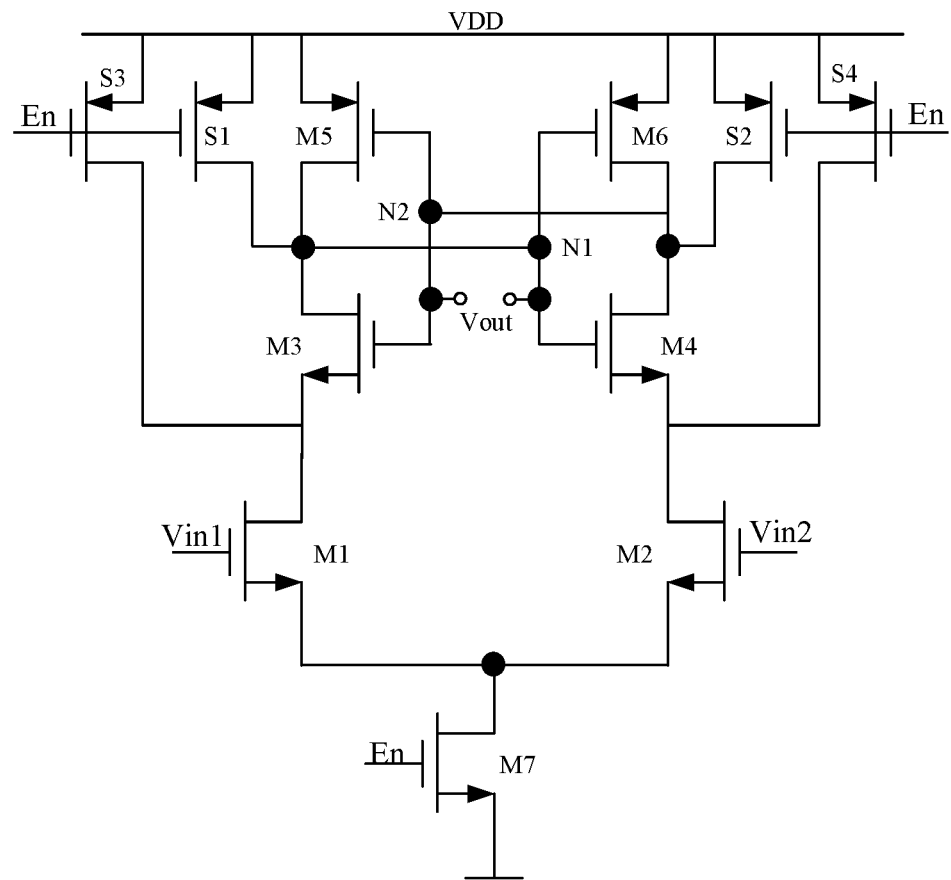
FIG. 6 is a schematic structure diagram of a comparison module in another embodiment of the present disclosure.

FIG. 6 is a schematic structure diagram of a comparison module in another embodiment of the present disclosure.

Referring to FIG. 6, the comparison module 11 may further include a third switching transistor S3 and a fourth switching transistor S4.

A first end of the third switching transistor S3 is connected to the power end VDD, a second end is connected to the drain of the first transistor M1, and a control end is connected to the enable end of the comparison module 11.

A first end of the fourth switching transistor S4 is connected to the power end VDD, a second end is connected to the drain of the second transistor M2, and a control end is connected to the enable end of the comparison module 11.

In one exemplary embodiment of the present disclosure, the first switching transistor S1, the second switching transistor S2, the third switching transistor S3, and the fourth switching transistor S4 are all P-type transistors.

In the embodiment illustrated in FIG. 6, the third switching transistor S3 is arranged between the drain of the first transistor M1 and the power supply VDD, the fourth switching transistor S4 is arranged between the drain of the second transistor M2 and the power supply VDD, and the third switching transistor S3 and the fourth switching transistor S4 are controlled by the enable signal. Thus, when the third switching transistor S3 and the fourth switching transistor S4 are both turned on under control of a low level (in some embodiments, the low level exists in a pulse signal generated by the pulse generation circuit 14) connected to the enable end, the source of the third transistor M3 and the source of the fourth transistor M4 are directly set to the high level VDD. In such case, according to the above analysis, the seventh transistor M7 is turned off and the first node N1 and the second node N2 are both at the high level VDD. When the third switching transistor S3 and the fourth switching transistor S4 are both turned off under control of a high level connected to the enable end, the seventh transistor M7 is turned on, the first transistor M1 and the second transistor M2 provide discharge paths, and the values of Vin1 and Vin2 affect an order of the first node N1 and the second node N2 reaching the low level GND, thereby causing the level of the other node to change to the high level VDD, and outputting a comparison result.

The drain of the first transistor M1 is directly set to VDD due to the arrangement of the third switching transistor S3, so as to avoid the case that the time for the first node N1 and the second node N2 to reach a stable high level VDD is affected since a junction capacitor of the turned-on first transistor M1 is charged by the turned-on third transistor M3 or a junction capacitor of the turned-on second transistor M2 is charged by the turned-on fourth transistor M4 after the first node N1 and the second node N2 are set to the high level VDD. Meanwhile, it is avoided that the voltage of the first node N1 is affected by voltage division of a resistor of the turned-on first transistor M1 and not exactly equal to the voltage of the second node N2 (also affected by voltage division of a resistor of the turned-on second transistor M2). Therefore, the arrangement of the third switching transistor S3 and the fourth switching transistor S4 can further increase the comparison speed of the comparator.

Since the first to fourth switching transistors S1-S4 and the seventh transistor M7 are all controlled by the enable signal En of the comparison module 11, only one enable signal in the form of a pulse signal may be used to realize the conversion of the enable level, thereby increasing the comparison speed of the comparator.

Therefore, the dynamic comparator illustrated in FIGS. 4-6 can greatly increase the output speed of the comparison result.

The present disclosure also provides a memory chip applying the comparison circuit as provided in any of the above-described embodiments.

Figure 7:
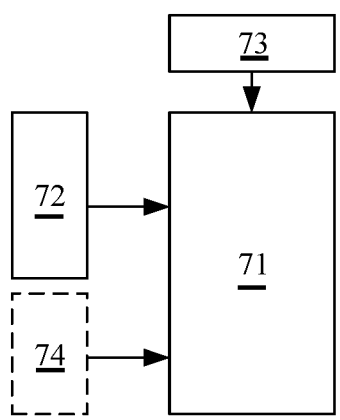
FIG. 7 illustrates a memory chip provided by an exemplary embodiment of the present disclosure.

FIG. 7 illustrates a memory chip provided by an exemplary embodiment of the present disclosure.

Referring to FIG. 7, the memory chip 700 may include a comparison circuit 71, a first power supply 72, and a second power supply 73.

The comparison circuit 71 is the comparison circuit as described in any one of the foregoing embodiments.

The first power supply 72 serves as the voltage to be measured. The second power supply 73 supplies power to the comparison circuit.

In one exemplary embodiment of the present disclosure, the memory chip further includes a reference voltage generation circuit 74 for generating the reference voltage Vref in the comparison circuit 71.

In the embodiment illustrated in FIG. 7, the second power supply 73 corresponds to the power supply VDD in the embodiments illustrated in FIGS. 4-6. The memory chip 700 may achieve a higher memory speed and lower power consumption due to the use of the comparison circuit 71 with a low power consumption and high comparison speed.

In the embodiments of the present disclosure, the storage timing of the state storage module 13 is controlled by the two output signals of the comparison module 11, so that the state storage module 13 stores an output signal of the comparator 11, the comparison rate can be effectively increased, and the power consumption can be reduced. The comparison module 11 is controlled by a pulse signal generated by the pulse generation module 14, so that the power consumption of the comparison circuit can be reduced. An internal circuit of the comparison module 11 is improved with the dynamic comparator, so that the comparison rate of the comparison module 11 can be increased. With the superimposed effects, the comparison circuit provided by the embodiments of the present disclosure may have a higher comparison speed and lower power consumption.

It should be noted that although several modules or units of a device for action execution are mentioned in the above detailed description, such partitioning is not mandatory. In practice, the features and functions of two or more modules or units described above may be embodied in one module or unit according to implementations of the present disclosure. Conversely, features and functions of one module or unit described above may be embodied by a plurality of modules or units.

Other embodiments of the disclosure will be apparent to those skilled in the art from consideration of the specification and practice of the invention disclosed here. This application is intended to cover any variations, uses, or adaptive changes of the disclosure following the general principles thereof and including such departures from the disclosure as come within known or customary practice in the art. It is intended that the specification and examples be considered as exemplary only, with a true scope and spirit of the disclosure being indicated by the appended claims.

According to embodiments of the present disclosure, output values of the comparator are stored by the state storage module, and the storage of the state storage module is controlled by control signals related to two output results of the comparison module, so that an interval time between two output comparison results by the comparator can be shortened, the output rate of the voltage comparison result can be greatly improved, and the output rate of the low-voltage comparison result in the DRAM can be improved under lower power consumption by using high-voltage power supply without a bias circuit.

What is claimed is:

1. A comparison circuit, comprising:
   a comparison module, comprising a first input end connected to a voltage to be measured and a second input end connected to a reference voltage;
   a state judgment module, comprising a first input end connected to a first output end of the comparison module and a second input end connected to a second output end of the comparison module; and
   a state storage module, comprising an input end connected to the first output end of the comparison module and an enable end connected to an output end of the state judgment module.

2. The comparison circuit of claim 1, further comprising:
   a pulse generation circuit, comprising an output end connected to an enable end of the comparison module.

3. The comparison circuit of claim 2, wherein an input end of the pulse generation circuit receives a pulse enable signal, and a control end of the state storage module receives a storage control signal.

4. The comparison circuit of claim 1, wherein the comparison module comprises:
   a first transistor, comprising a gate serving as the first input end of the comparison module;
   a second transistor, comprising a gate serving as the second input end of the comparison module;
   a third transistor, comprising a source connected to a drain of the first transistor;
   a fourth transistor, comprising a source connected to a drain of the second transistor;
   a fifth transistor, comprising a drain serving as the first output end of the comparison module and connected to a drain of the third transistor and a gate of the fourth transistor, and a source connected to a power end;
   a sixth transistor, comprising a drain serving as the second output end of the comparison module and connected to a drain of the fourth transistor and a gate of the third transistor, and a source connected to the power end; and
   a seventh transistor, comprising a gate serving as the enable end of the comparison module, and a drain connected to a source of the first transistor and a source of the second transistor and a source grounded.

5. The comparison circuit of claim 4, wherein the comparison module further comprises:
   a first switching transistor, comprising a first end connected to the power end, a second end connected to the first output end of the comparison module, and a control end connected to the enable end of the comparison module; and a second switching transistor, comprising a first end connected to the power end, a second end connected to the second output end of the comparison module, and a control end connected to the enable end of the comparison module.

6. The comparison circuit of claim 5, wherein the comparison module further comprises:
   a third switching transistor, comprising a first end connected to the power end, a second end connected to the drain of the first transistor, and a control end connected to the enable end of the comparison module; and
   a fourth switching transistor, comprising a first end connected to the power end, a second end connected to the drain of the second transistor, and a control end connected to the enable end of the comparison module.

7. The comparison circuit of claim 6, wherein the first switching transistor, the second switching transistor, the third switching transistor, and the fourth switching transistor are all P-type transistors.

8. The comparison circuit of claim 6, wherein the first transistor, the second transistor, the third transistor, the fourth transistor, and the seventh transistor are all N-type transistors.

9. The comparison circuit of claim 6, wherein the fifth transistor and the sixth transistor are P-type transistors.

10. The comparison circuit of claim 1, wherein the state storage module is a flip-flop or a register.

11. The comparison circuit of claim 1, wherein the state judgment module comprises an exclusive OR gate.

12. The comparison circuit of claim 1, wherein the voltage to be measured changes from a first voltage to a second voltage within time T.

13. The comparison circuit of claim 12, wherein the reference voltage is greater than the first voltage and less than the second voltage.

14. The comparison circuit of claim 1, wherein an output signal of the state judgment module is configured to control storage timing of the state storage module.

15. A memory chip, comprising:
    a comparison circuit, comprising:
       a comparison module, comprising a first input end connected to a voltage to be measured and a second input end connected to a reference voltage;
       a state judgment module, comprising a first input end connected to a first output end of the comparison module and a second input end connected to a second output end of the comparison module; and
       a state storage module, comprising an input end connected to the first output end of the comparison module and an enable end connected to an output end of the state judgment module; and
    a first power supply serving as the voltage to be measured, and a second power supply for supplying power to the comparison circuit.

16. The memory chip of claim 15, further comprising:
    a reference voltage generation circuit, configured to generate the reference voltage.

* * * * *